(12) United States Patent
Fukumori et al.

(10) Patent No.: US 10,056,156 B2
(45) Date of Patent: Aug. 21, 2018

(54) INFORMATION PROCESSING APPARATUS AND METHOD OF CONTROLLING ARITHMETIC PROCESSING APPARATUS

(71) Applicant: FUJITSU LIMITED, Kawasaki-shi, Kanagawa (JP)

(72) Inventors: Masato Fukumori, Chohu (JP); Koji Fujita, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/378,119

(22) Filed: Dec. 14, 2016

(65) Prior Publication Data

US 2017/0194061 A1 Jul. 6, 2017

(30) Foreign Application Priority Data

Jan. 6, 2016 (JP) ................................ 2016-000825

(51) Int. Cl.
*G11C 29/00* (2006.01)
*G11C 29/38* (2006.01)
*G06F 11/22* (2006.01)

(52) U.S. Cl.
CPC .......... *G11C 29/38* (2013.01); *G06F 11/2284* (2013.01)

(58) Field of Classification Search
None
See application file for complete search history.

(56) References Cited

U.S. PATENT DOCUMENTS 9,824,016 B2* 11/2017 Kimura ............... G06F 12/0862
2015/0212939 A1* 7/2015 Tani ....................... G06F 12/084
 711/130
2016/0203081 A1* 7/2016 Kimura ............... G06F 12/0862
 711/125
2016/0283250 A1* 9/2016 Fujiwara ............... G06F 9/4405
2016/0350196 A1* 12/2016 Suga ..................... G06F 11/273

FOREIGN PATENT DOCUMENTS

JP 5-265766 10/1993
JP 7-168768 7/1995
JP 11-096012 4/1999

* cited by examiner

*Primary Examiner* — Daniel McMahon
(74) *Attorney, Agent, or Firm* — Fujitsu Patent Center

(57) ABSTRACT

An information processing apparatus includes an arithmetic processing apparatus, a main memory and an auxiliary memory configured to store a program for diagnosing the main memory and diagnosing an apparatus accessed by the arithmetic processing apparatus. The arithmetic processing apparatus executes the program stored in the auxiliary memory to determine whether the program can be executed on the main memory. The arithmetic processing apparatus executes the program on the main memory when the arithmetic processing apparatus determines that the program can be executed on the main memory and executes the program on the auxiliary memory when the arithmetic processing apparatus determines that the program cannot be executed on the main memory.

6 Claims, 6 Drawing Sheets

FIG. 6

| MANAGEMENT AREA | MEMORY DIAGNOSIS RESULT | PHYSICAL ADDRESS INDEX |
|---|---|---|
| DIMM#0-0 | ERROR | 0 |
| DIMM#0-1 | ERROR | 1 |
| DIMM#0-2 | ERROR | 2 |
| DIMM#0-3 | ERROR | 3 |
| DIMM#1-0 | ERROR | 8 |
| DIMM#1-1 | ERROR | 9 |
| DIMM#1-2 | ERROR | 10 |
| DIMM#1-3 | NORMAL | 11 |
| DIMM#2-0 | NORMAL | 16 |
| DIMM#2-1 | ERROR | 17 |
| DIMM#2-2 | ERROR | 18 |
| DIMM#2-3 | ERROR | 19 |
| DIMM#3-0 | NORMAL | 24 |
| DIMM#3-1 | NORMAL | 25 |
| DIMM#3-2 | NORMAL | 26 |
| DIMM#3-3 | NORMAL | 27 |

INFORMATION PROCESSING APPARATUS AND METHOD OF CONTROLLING ARITHMETIC PROCESSING APPARATUS

CROSS-REFERENCE TO RELATED APPLICATION

This application is based upon and claims the benefit of priority of the prior Japanese Patent Application No. 2016-000825, filed on Jan. 6, 2016, the entire contents of which are incorporated herein by reference.

FIELD

The embodiments discussed herein are related to an information processing apparatus and a method of controlling an information processing apparatus.

BACKGROUND

In a computer, a Central Processing Unit (CPU) executes a Power On Self-Test program, which is a program for initializing and diagnosing hardware in the computer, when the computer is powered on.

Instruction codes of the POST are stored in advance in Read-Only Memory (ROM), which is an auxiliary storage device of the computer. The execution of the instruction codes of the POST stored in the ROM is initiated when the computer is powered on. And the computer executes processes of the POST by executing the instruction codes (see Patent Documents 1 and 2).

In another case, the instruction codes of the POST are transferred from the ROM to main memory of the computer in the POST program when the diagnosis of the main memory is performed by the POST, the diagnosis is terminated normally and the main memory becomes available. In this case, after the instruction codes are transferred to the main memory, the computer executes the processes of the POST by executing the instruction codes on the main memory. In addition, the POST suspends the processes of the computer when the diagnosis of the main memory performed by the POST is suspended (see Patent Document 3).

The following patent document describes conventional techniques related to the techniques described herein.

PATENT DOCUMENT

[Patent document 1] Japanese Laid-Open Patent Publication No. Hei11-096012
[Patent document 2] Japanese Laid-Open Patent Publication No. Hei07-168768
[Patent document 3] Japanese Laid-Open Patent Publication No. Hei05-265766

SUMMARY

According to one embodiment, it is provided an information processing apparatus including an arithmetic processing apparatus, main memory and auxiliary memory configured to store a program for diagnosing the main memory and diagnosing an apparatus accessed by the arithmetic processing apparatus. The arithmetic processing apparatus executes the program stored in the auxiliary memory to determine after diagnosing the main memory whether the program can be executed on the main memory.

The arithmetic processing apparatus executes the program on the main memory when the arithmetic processing apparatus determines that the program can be executed on the main memory. The arithmetic processing apparatus executes the program on the auxiliary memory when the arithmetic processing apparatus determines that the program cannot be executed on the main memory.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 6 is a diagram illustrating an example of a management table of results of memory diagnosis according to an embodiment.

DESCRIPTION OF EMBODIMENTS

Figure 1:
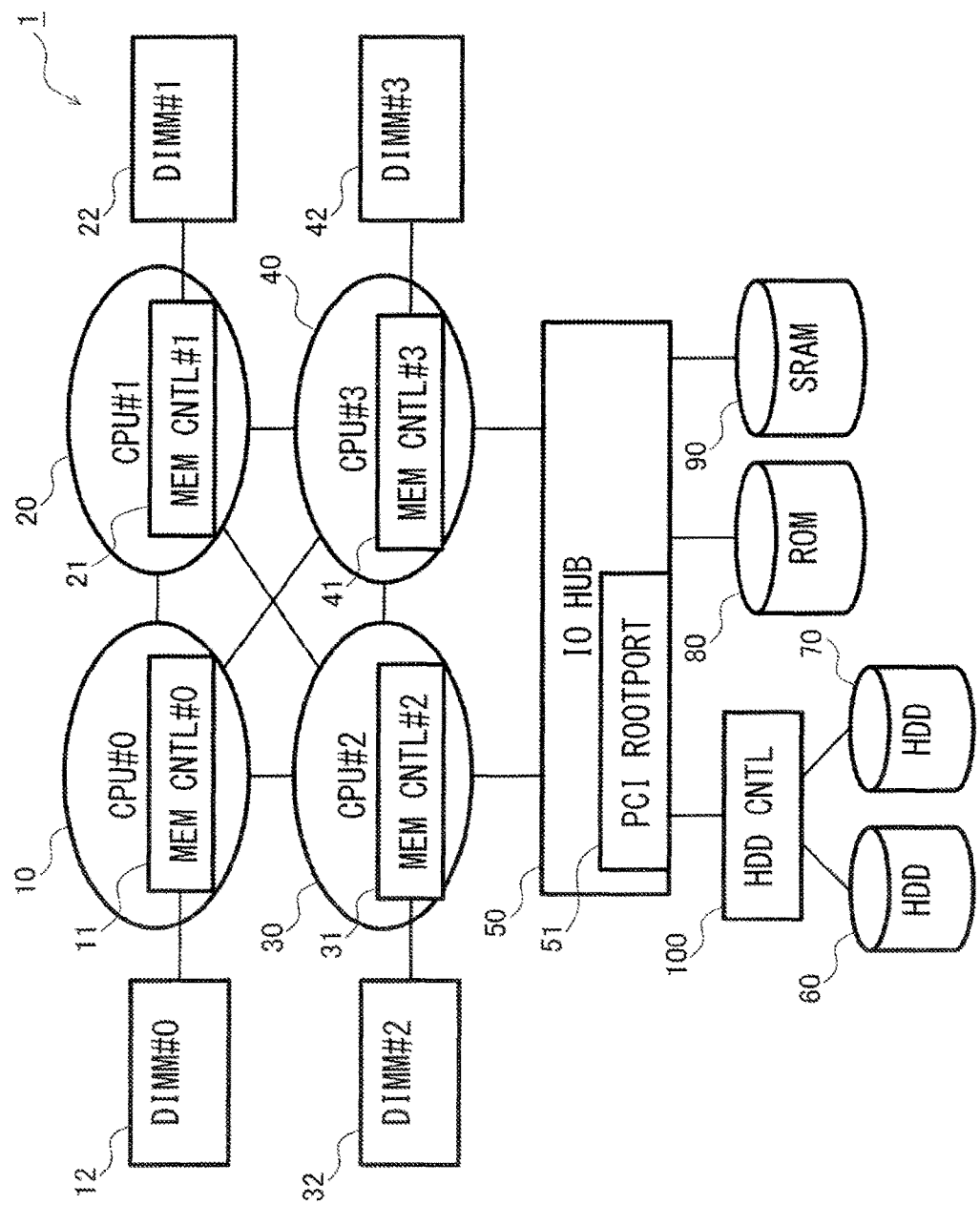
FIG. 1 is a diagram illustrating an example of a configuration of a computer according to an embodiment.

It is desirable to speed up the POST processes in order to shorten the period between the power-on of the computer and a state in which the user can use the computer. In addition, in the operations of a large-scale system in which a number of computers are connected with one another, it is important to ensure stable operations of the computers and shorten the time in which the computer(s) is suspended. In such a system, it is desirable to detect as many as possible of hardware failures in the computers in a system which ensures high system reliability in order to use the detected failures for making decisions in system maintenance and replacement. However, when the techniques as described above are used to perform the POST processes in the instruction execution on the ROM, it is difficult to accelerate the POST processes. Further, when the state of the main memory returns from the abnormal state to the normal state and the instruction codes of the POST are transferred from the ROM to the main memory in the technique as described above, and then the diagnosis of the main memory performed by the POST is aborted, subsequent diagnosis processes cannot be performed. As a result, when a failure occurs in hardware as a target of the subsequent diagnosis processes the computer is suspended without the failure detected. Embodiments are described below with reference to the drawings. Configurations of the following embodiment are exemplifications, and the present apparatus is not limited to the configurations of the embodiment.

First Embodiment

A computer 1 as an example of an information processing apparatus according to the first embodiment is described below. As illustrated in a configuration diagram in FIG. 1, the computer 1 includes a CPU#0 10, a CPU#1 20, a CPU#2 30, a memory controller#0 11, a memory controller#1 21, a memory controller#2 31, a memory controller#3 41, a Dual Inline Memory Module (DIMM) #0 12, a DIMM#1 22, a DIMM#2 32, a DIMM#3 42 and an Input/Output (I/O) hub 50. It is noted that the CPU#0 10, the CPU#1 20, the CPU#2 30 and the CPU#3 40 are examples of arithmetic processing apparatuses. In addition, the combination of the memory controller#0 11 and the DIMM#0 12 connected with the memory controller#0 is an example of the main memory.

The I/O hub connects hardware in the computer 1 with the main memory. That is, the CPU#0 is directly connected with the DIMM#0 in the example in FIG. 1. It is noted here that the feature that the CPU#0 is "directly" connected with the DIMM#0 means that a control circuit in the CPU#0 is connected with the DIMM#0, for example. On the other hand, the CPU#0 is connected with the DIMM#1, DIMM#2 and DIMM#3 via an interconnect, the CPU#1, the CPU#2 and the CPU#3. Further, the CPU#1, the CPU#2 and the CPU#3 are connected with the DIMM#0 via the interconnect and the CPU#0 . Moreover, the I/O hub 50 is connected with the CPU#0, the CPU#1, the CPU#2 and the CPU#3 via the interconnect. The CPU#0, the CPU#1, the CPU#2 and the CPU#3 are connected with a ROM 80 and a SRAM 90 via the I/O hub 50.

Therefore, Hard Disk Drives (HDD) 60 and 70, ROM 80 and Static Random Access Memory (SRAM) 90 are examples of the hardware as illustrated in FIG. 1. The I/O hub 50 includes a Peripheral Component Interconnect (PCI) root port 51 connected with an HDD controller 100. The I/O hub 50 and the HDDs 60 and 70 are connected with each other via the PCI root port 51 and the HDD controller 100.

As described above, the I/O hub 50 functions as a boundary between the main memory and the peripheral elements in the present embodiment. The ROM 80 stores the instruction codes of the POST and read data used in the processes of the POST. In addition, the SRAM 90 stores read and written data used in the processes of the POST. It is noted that the ROM 80 is an example of auxiliary memory.

As described above, the CPU#0 10, the CPU#1 20, the CPU#2 30 and the CPU#3 40 are connected with each other by dedicated interconnects. Also, the CPU#0 10, the CPU#1 20, the CPU#2 30 and the CPU#3 40 are connected with the I/O hub 50 by dedicated interconnects. The CPU#0 10, the CPU#1 20, the CPU#2 30, the CPU#3 40 and hardware connected with the I/O hub 50 access the DIMM#0 12, the DIMM#1 22, the DIMM#2 32 and the DIMM#3 42 via the interconnects. The CPU#0 10, the CPU#1 20, the CPU#2 30 and the CPU#3 40 accept an access from the I/O hub 50 via the interconnects and access the DIMM#0 12, the DIMM#1 22, the DIMM#2 32 and the DIMM#3 42 via an address bus.

Figure 2:
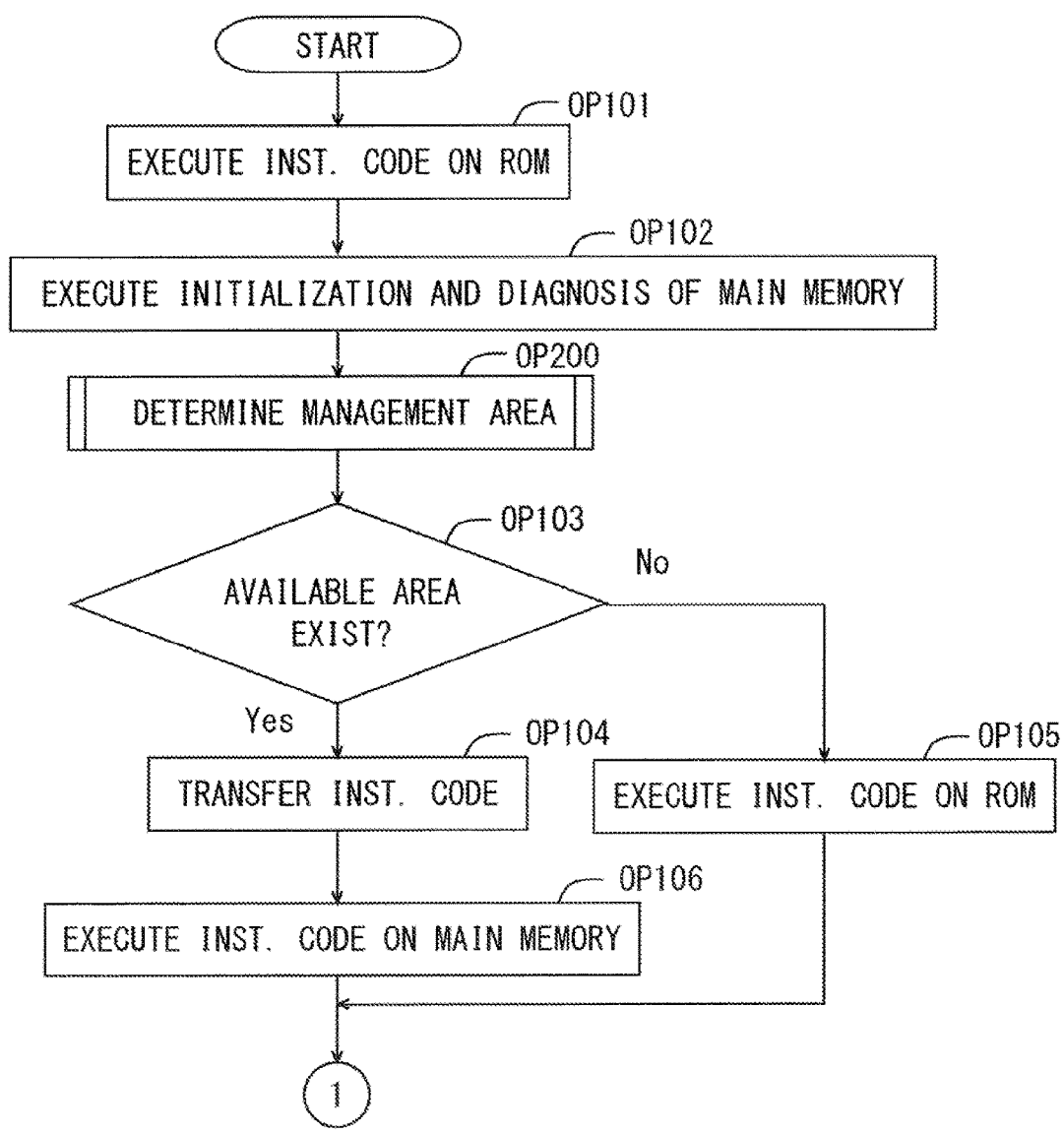
FIG. 2 is a diagram illustrating an example of a first flowchart performed by a computer according to an embodiment.
Figure 3:
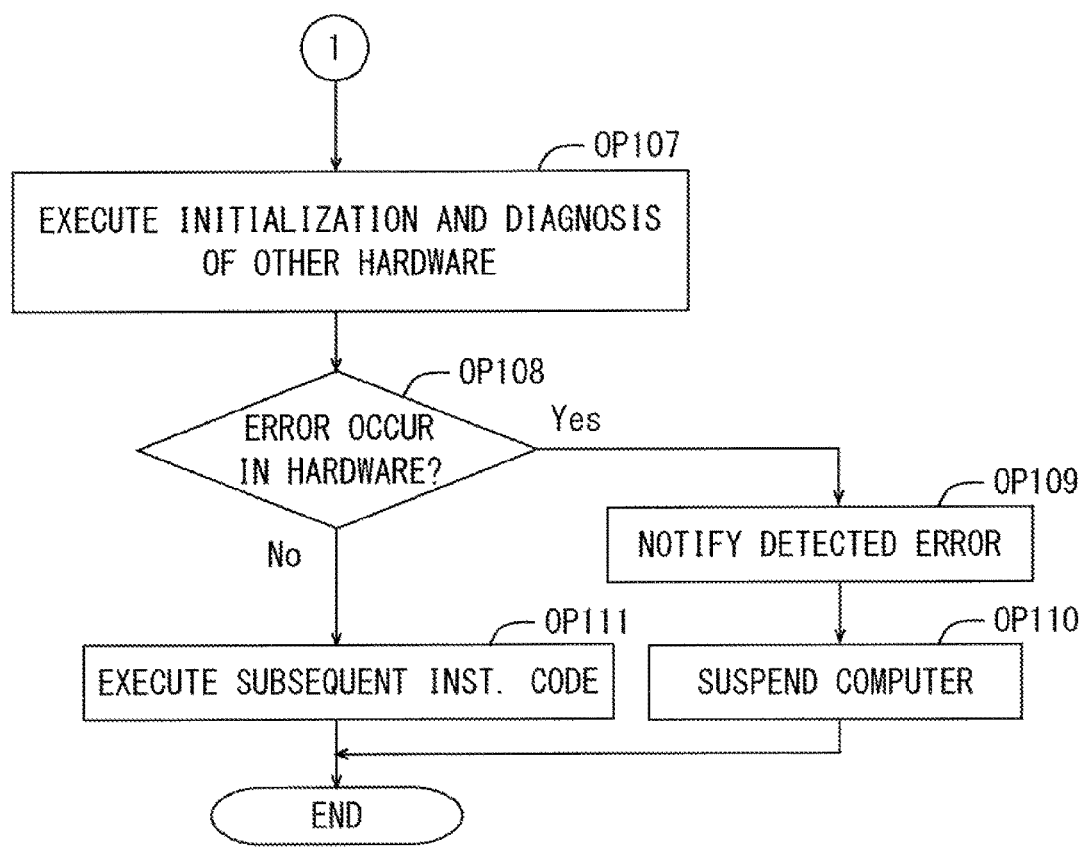
FIG. 3 is a diagram illustrating an example of a second flowchart performed by a computer according to an embodiment.

Next, an example of the storage of data used in the processes performed by the CPU#0 10 and the processes of the POST in the present embodiment is described with reference to FIGS. 2 to 4. FIGS. 2 and 3 illustrate an example of a flowchart of processes performed by the computer 1 when the computer 1 is powered on. It is noted that "1" in FIG. 2 is connected with "1" in FIG. 3. In the present embodiment, the CPU#0 10 initiates the processes in the flowchart in FIG. 2 when the computer 1 is powered on.

In the following descriptions, a "POST instruction code" denotes an instruction code for performing the processes of the POST, "POST ro data" denotes read-only data used in the processes of the POST and "POST rw data" denotes data for reading and writing used in the processes of the POST.

In OP101, the CPU#0 10 initiates execution of a POST instruction code stored in the ROM 80. Read-only data used in the processes of the POST when the instruction code is executed is also stored in the ROM 80. In addition, data for reading and writing used in the processes of the POST when the instruction code is executed is stored in the SRAM 90. Next, the process proceeds to OP102.

In OP102, the CPU#0 10 performs initialization and diagnosis of the main memory of the computer 1 according to the POST instruction codes executed on the ROM 80. Specifically, the CPU#0 10 performs the initialization and diagnosis of the memory controller#0 11, the memory controller#1 21, the memory controller#2 31 and the memory controller#3 41. The CPU#0 10 initializes a register of each memory controller and diagnoses each memory controller to check an error. In addition, the CPU#0 10 performs the initialization and diagnosis of the DIMM#0 12, the DIMMI#1 22, the DIMMI#2 32 and the DIMMI#3 42 after the diagnosis of each memory controller. It is noted that the operations of the CPU#0 10 when the CPU#0 10 executes the instruction codes of the POST on the ROM 80 is similar to the operations of the CPU#0 10 when the CPU#0 10 executes the instruction codes of the POST on the DIMM#0 12. That is, although there is a difference between an address on the DIMM or an address on the ROM as an address determined by a program counter used by the CPU#0 10, the other operations of the CPU#0 are similar in both cases.

The processes of the initialization and diagnosis of the DIMM#0 12, the DIMM#1 22, the DIMM#2 32 and the DIMM#3 42 performed by the CPU#0 10 in OP102 are described below with reference to FIGS. 4 to 6. As an example of the process in OP102, the CPU#0 10 creates a management table for storing results of the diagnosis of the DIMM#0 12, the DIMM#1 22, the DIMM#2 32 and the DIMM#3 42 in a POST rw data area in the SRAM 90.

It is assumed in the present embodiment that each storage area in the DIMM#0 12, the DIMMI#1 22, the DIMM#2 32 and the DIMM#3 42 is divided into four management areas. Therefore, in the management table created in the SRAM 90, the management area for the DIMM#0 12 is divided into four areas, a DIMM#0-0, a DIMM#0-1, a DIMM#0-2 and a DIMM#0-3, for example. It is also assumed here that the size of each management area is the same, as one example. In addition, each storage area in the DIMMs is divided by a predetermined byte and each divided storage area can be designated as the management area. Alternatively, the sizes of the memory controllers or memory modules connected with the DIMMs can be used to determine the unit for dividing each storage area in the DIMMs.

In the present embodiment, a value obtained by dividing the initial address of a management area by the size of the management area as illustrated by the following formula (1) is stored as a "physical address index" in the management table in order to indicate whether a plurality of management areas are physically successive.

(Physical Address Index)=(Initial Physical Address of Management Area)/(Size of Management Area)    (1)

It is noted in the present embodiment that the management areas are arranged in ascending order of magnitude of value of physical address index in the management table. In addition, the fact that the numbers of the physical address indexes are successive means that the management areas corresponding to the physical address indexes are physically successive. It is noted that a method of using physical address indexes obtained by the above formula (1) is an example of a method of indicating that management areas are physically successive. Therefore, an alternative method can be used to indicate whether management areas are physically successive.

The CPU#0 10 execute the POST instruction codes to perform memory diagnosis for each management area in the DIMM#0 12, the DIMM#1 22, the DIMM#2 32 and the DIMM#3. And the CPU#0 10 stores the result of each memory diagnosis in each corresponding entry in the "Memory Diagnosis Result" column in the management table. For example, when the CPU#0 10 diagnoses an error occurs in any one of the memory controller#0 11, the memory controller#1 21, the memory controller#2 31 and the memory controller#3 41, the CPU#0 10 stores the memory diagnosis result as "Error" in the management table for each management area in DIMMs connected with the memory controller in which the error occurs.

In the case of the management table illustrated in FIG. 6, since the CPU#0 10 diagnoses that an error occurs in the memory controller#0 11, the CPU#0 10 stores information indicating "Error" in the "Memory Diagnosis Result" column for each management area DIMM#0-0, DIMM#0-1, DIMM#0-2 and DIMM#0-3 in the DIMM#1 22 in the management table. In the case of the management table illustrated in FIG. 6, the CPU#0 10 also stores information indicating "Error" in the "Memory Diagnosis Result" column for each management area DIMM#1-0, DIMM#1-1 and DIMM#1-2 in the DIMM#1 22 and each management area DIMM#2-1, DIMM#2-2 and DIMM#2-3 in the DIMM#2 32 in the management table. This is because the CPU#0 10 also diagnoses that an area in which a failure occurs exists in each management area.

The CPU#0 10 stores the memory diagnosis results of each management area in the DIMM#0 12, the DIMM#1 22, the DIMM#2 32 and the DIMM#3 in the management table. Next, the process proceeds to OP200. FIG. 4 illustrates processes performed in the subroutine in OP200.

In OP201, the CPU#0 10 calculates the sum of the size of POST instruction codes which have not been executed, the size of POST ro data and the size of POST rw data. The sum is referred to as "POST code size".

In the following processes, the CPU#0 10 determines based on the calculated POST code size whether the POST instruction codes, the POST ro data and the POST rw data can be stored in the management area. First, the CPU#0 10 references the management table to check the entry in the "Memory Diagnosis Result" column for the management areas in ascending order of value of physical address index, that is starting from the management area DIMM#0-0 in the example in FIG. 6. In the example in FIG. 6, the CPU#0 10 determines the management area of which the value of the physical address index is 0. And the CPU#0 10 determines whether the "Memory Diagnosis Result" for the determined management area indicates "Normal" (OP202). When the CPU#0 10 determines that the "Memory Diagnosis Result" for the determined management area indicates "Normal" (OP202: Yes), the process proceeds to OP203. On the other hand, when the CPU#0 10 determines that the CPU#0 10 determines whether the "Memory Diagnosis Result" for the determined management area does not indicate "Normal" (OP202: No), the process proceeds to OP204.

In OP203, the CPU#0 10 determines whether the POST code can be stored in the management area. Specifically, the CPU#0 10 determines based on the value obtained by calculating "(POST code size)/(Size of One Management Area)" whether the "Memory Diagnosis Results" for the management areas of which the "Physical Address Indexes" are successive indicate "Normal". It is noted here that the CPU#0 10 uses values obtained by rounding out the value obtained by calculating "(POST code size)/(Size of One Management Area)" to the whole number to perform the determination in OP203. For example, when the CPU#0 10 determines based on the result in OP202 that the "Memory Diagnosis Results" for the management areas of which the "Physical Address Indexes" are successive according to the rounded out value indicate "Normal", the CPU#0 10 terminates the processes in the subroutine and the process proceeds to OP103. On the other hand, when the CPU#0 10 determines based on the result in OP202 that at least one of the "Memory Diagnosis Results" for the management areas of which the "Physical Address Indexes" are successive according to the rounded out value does not indicate "Normal", the process proceeds to OP204.

In OP204, the CPU#010 determines the "Physical Address Index" for the management area which is subject to the process in OP202 is a maximum value, that is a value indicating the end of the index". When the "Physical Address Index" is a value indicating the end of the index (OP204: Yes), the CPU#0 10 determines that there is not a management area for which the process in OP202 has not been performed, terminates the processes in the subroutine and the process proceeds to OP103. On the other hand, when the "Physical Address Index" is not a value indicating the end of the index (OP204: No), that is the "Physical Address Index" does not reach the end of the index, the CPU#0 10 adds 1 to the value of the "Physical Address Index" for the management area which is subject to the process in OP202 (OP205) and returns the process to OP202.

In the example of the management table in FIG. 6, the "Memory Diagnosis Results" for the management area DIMM#1-3 in the DIMM#1, the management area DIMM#2-0 in the DIMM#2 and the management areas DIMM#3-0, DIMM#3-1, DIMM#3-2 and DIMM#3-3 in the DIMM#3 indicate "Normal". Therefore, when POST code can be stored in one management area in the above processes, the CPU#0 10 determines in OP202 that the "Memory Diagnosis Result" for the management area DIMM#1-3 is "Normal". Next, the CPU#0 10 determines in OP203 that the POST code can be stored in the management area DIMM#1-3 (OP203: Yes) and terminates the processes in the subroutine. As a result, it is determined in this case that the management area DIMMI#1-3 can be used for storing POST instruction codes, POST ro data and POST rw data.

As described above, POST instruction codes, POST ro data and POST rw data can be stored in one management area when POST code size is within the size of one management area. Therefore, as long as the diagnosis of the management area as described above detects that any one of the management areas is normal, a process for determining whether the management areas are successive can be omitted in the diagnosis. As a result, the diagnosis as described above is simplified in comparison with diagnosis according to conventional techniques.

In the present embodiment, it can be assumed as another example that a management table is as illustrated in FIG. 6 and the value obtained by rounding out the value calculated by the formula "(POST code size)/(Size of One Management Area)" is 4. In this case, the CPU#0 10 repeats the processes in OP202, OP203, OP204 and OP205 for the management areas DIMM#3-0, DIMM#3-1 and DIMM#3-2 by repeating the processes as described above. As for the management area DIMM#3-3, the CPU#0 10 determines that the "Memory Diagnosis Result" for the management area DIMM#3-3 is "Normal" in OP202 (OP202: Yes). And the CPU#0 10 determines in OP203 that the size of the POST code is within the size of the four successive management areas DIMM#3-0, DIMM#3-1, DIMM#3-2 and DIMM#3-3 (OP203: Yes) and terminates the processes in the subroutine. And the process proceeds to OP103. As a result, the management areas DIMM#3-0, DIMM#3-1, DIMM#3-2 and DIMM#3-3 are areas available for storing the POST instruction codes, the POST ro data and the POST rw data in the present embodiment.

Therefore, in the case in which the size of POST code is above the size of one management area, the physically successive management areas which can store the POST instruction codes, the POST ro data and the POST rw data can be detected even when the diagnosis as described above determines that the "Memory Diagnosis Result" for a management area indicates "Error". That is, a better chance that the POST instruction codes can be executed on the main memory can be achieved in comparison with the conventional techniques.

When the processes of the subroutine in OP202 detect an area available for storing the POST instruction codes, the POST ro data and the POST rw data (OP103: Yes), the process proceeds to OP104. On the other hand, when the processes of the subroutine in OP202 does not detect an area available for storing the POST instruction codes, the POST ro data and the POST rw data (OP103: No), the process proceeds to OP105.

The CPU#0 10 transfers in OP104 the POST instruction codes and the POST ro data stored in the ROM 80 and the POST rw data stored in the SRAM 90 to the area(s) detected in OP103. Next, the process proceeds to OP106. As a result of the process in OP104, the POST instruction codes, the POST ro data and the POST rw data are stored in the DIMM#3 42 as illustrated in FIG. 5, for example. The CPU#0 10 executes in OP106 the POST instruction codes on the main memory. In the example in FIG. 6, the CPU#0 10 uses the POST instruction codes, the POST ro data and the POST rw data transferred to the management areas DIMM#3-0, DIMM#3-1, DIMM#3-2 and DIMM#3-3 in the DIMM#3 42 to execute the POST instruction codes on the DIMM#3 42.

On the other hand, the CPU#0 10 uses the POST instruction codes and the POST ro data stored in the ROM 80 and the POST rw data stored in the SRAM 90 to execute the POST instruction codes on the ROM 80 in OP105. Thus, the CPU#0 10 performs in OP107 the initialization and diagnosis of the hardware in the computer 1 according to the processes of the executed POST instruction codes in OP105 or OP106.

Since POST instruction codes are executed on a DIMM in OP103 and OP104 without using an interconnect and the I/O hub 50 in the present embodiment, the processes can be accelerated in comparison with the conventional techniques in which the POST instruction codes area executed on a ROM. In addition, a DIMM of which apart is diagnosed as "Error" is diagnosed as "Error" even when a normal area which can stores the POST instruction codes, the POST ro data and the POST rw data exist in the DIMM in the conventional techniques. Further, when the computer is suspended when a DIMM is diagnosed as "Error", hardware diagnoses which are to be executed in the subsequent POST processes are not executed. On the other hand, when a part of an area in a DIMM is diagnosed as "Error" but an area is detected as "Normal" for storing POST instruction codes, POST ro data and POST rw data, the data can be transferred to the area diagnosed as "Normal". Therefore, the POST processes can be accelerated in the present embodiment in comparison with the case in which the POST processes are executed on a ROM as in conventional techniques. In addition, the diagnosis of hardware which is to be performed subsequently can be continued even when the part of the main memory is diagnosed as "Error".

In OP108, the CPU#0 10 determines whether the diagnosis of the hardware performed in OP107 indicates an error. When the diagnosis of the hardware indicates an error (OP108: Yes), the process proceeds to OP109. On the other hand, when the diagnosis of the hardware indicates normal (OP108: No), the process proceeds to OP111.

In OP109, the CPU#0 10 notifies the error detected in the diagnosis of the hardware performed in OP107. For example, the CPU#0 10 displays the details of the detected error and an message related to the error etc. as the notification on the display (not illustrated) of the computer 1. Next, the process proceeds to OP110. In OP110, the CPU#0 10 suspends the computer 1 since the CPU#0 10 determines that an error occurs in the hardware based on the diagnosis result in OP107. And the CPU#0 10 terminates the processes in the flowchart.

In OP111, the CPU#0 10 continues the processes of the execution of the POST instruction codes on the DIMM and executes the POST instruction codes which is to be executed subsequent to the POST instruction codes executed in OP106.

In the embodiment as described above, the processes in the flowcharts are executed to determine in the diagnosis of the main memory whether each management area in the main memory is normal, and then the data such as the POST instruction codes is transferred to the area diagnosed as normal. As a result, since the POST instruction codes for diagnosing the hardware other than the main memory can be executed on the main memory, the processes can be accelerated in comparison with the case in which the processes are executed on a ROM as in conventional techniques. In addition, when a management area in the main memory is diagnosed as "Error" but a normal management area for storing the data such as the POST instruction codes is detected, the data can be transferred to the normal management area. As a result, since the subsequent POST instruction codes can be executed even when the management area diagnosed as "Error" exists in the main memory, the initialization and diagnosis of the hardware other than the main memory can be executed.

Although specific embodiments are described above, the configurations of the information processing system etc. described and illustrated in each configuration example can be arbitrarily modified and/or combined. For example, the POST instruction codes, the POST ro data and the POST rw data are stored in the DIMM#3 42 as illustrated in FIG. 5, that is in a management area in the main memory. However, the POST processes can be accelerated in comparison with the case in which the POST processes are executed on a ROM as long as at least the POST instruction codes for the POST processes are stored in the management area in the main memory. Therefore, the size of the POST instruction codes can be used as the POST code size in the above embodiment.

It is assumed in the above embodiment that the POST instruction codes, the POST ro data and the POST rw data are stored in one management area or physically successive management areas. However, the CPU#0 10 can determine whether each of the POST instruction codes, the POST ro data and the POST rw data can be stored in one management area or physically successive management areas. In this case, there is a possibility of a case in which the POST instruction codes, the POST ro data and the POST rw data are stored in different management areas. Therefore, the processes in the flowcharts as described above can be configured to pass the initial addresses of the management areas in which the POST ro data and the POST rw data are stored to the POST instruction codes.

Figure 4:
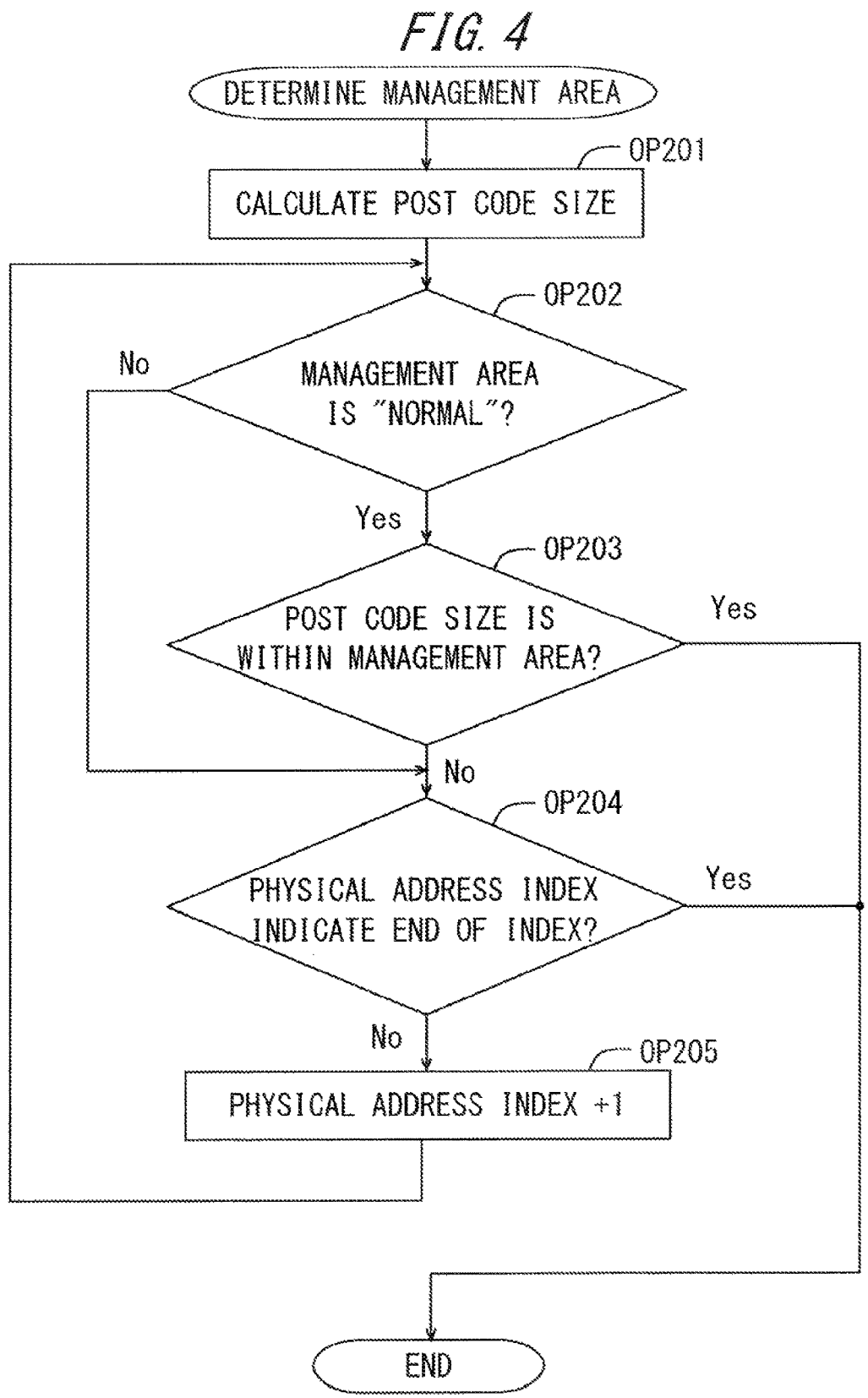
FIG. 4 is a diagram illustrating an example of a third flowchart performed by a computer according to an embodiment.
Figure 5:
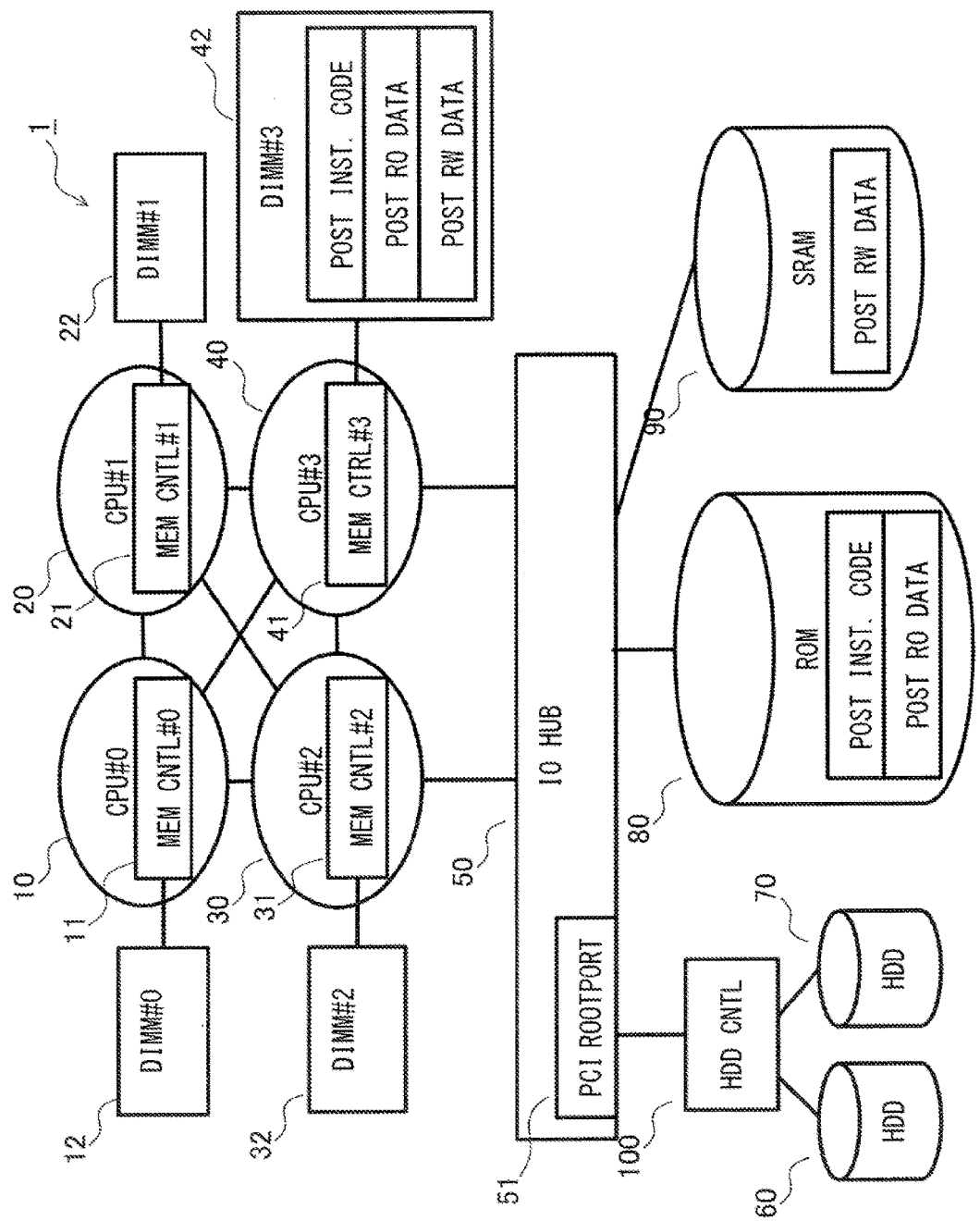
FIG. 5 is a diagram illustrating another example of a configuration of a computer according to an embodiment.

Further, the CPU#0 10 initiates the processes in the flowcharts in FIGS. 2 to 4 in the above embodiment. However, a CPU other than the CPU#0 10 can be configured to initiate the processes. Moreover, the CPU#0 10, the CPU#1 20, the CPU#2 30 and the CPU#3 40 can be configured to execute the processes as described above to check whether an area which can store the POST instruction data, the POST ro data and the POST rw data exists in the DIMM#0 12, the DIMM#1 22, the DIMM#2 32 and the DIMM#3 42, which are directly connected with the CPU#0 10, the CPU#1 20, the CPU#2 30 and the CPU#3 40, respectively.

Moreover, the CPU as described above is not limited to a single processor but can be configured as multiple processors. In addition, the CPU can be configured as a multi-core processor and each CPU is connected via a single socket with each other. A part or the whole of the processes can be executed by a Digital Signal Processor (DSP), a Graphics Processing Unit (GPU), a numerical processor, a vector processor, a dedicated processor such as an image processing processor and an Application Specific Integrated Circuit (ASIC) etc. Furthermore, at least a part of the elements in the above embodiment can be a digital circuit such as a dedicated Large Scale Integration (LSI) including a Field-Programmable Gate Array. An analog circuit can be also used in at least a part of the elements in the above embodiment.

Computer Readable Recording Medium

It is possible to record a program which causes a computer to implement any of the functions described above on a computer readable recording medium. In addition, by causing the computer to read in the program from the recording medium and execute it, the function thereof can be provided.

The computer readable recording medium mentioned herein indicates a recording medium which stores information such as data and a program by an electric, magnetic, optical, mechanical, or chemical operation and allows the stored information to be read from the computer. Of such recording media, those detachable from the computer include, e.g., a flexible disk, a magneto-optical disk, a CD-ROM, a CD-R/W, a DVD, a DAT, an 8-mm tape, and a memory card. Of such recording media, those fixed to the computer include a hard disk and a ROM.

According to one aspect, it is provided an information processing apparatus which accelerate processes in a program for detecting failures in the apparatus at the time of startup and increase the chance of the detections of the failures in the apparatus.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An information processing apparatus, comprising:
an arithmetic processing apparatus;
a main memory that includes a plurality of storage areas; and
an auxiliary memory configured to store a program for diagnosing the main memory and diagnosing an apparatus accessed by the arithmetic processing apparatus, the arithmetic processing apparatus:
  executes the program stored in the auxiliary memory to determine whether the program can be executed on the main memory,
  executes the program on the main memory when the arithmetic processing apparatus determines that the program can be executed on the main memory,
  executes the program on the auxiliary memory when the arithmetic processing apparatus determines that the program cannot be executed on the main memory,
  first determines that the program can be executed on the main memory when the program can be stored in at least one of the plurality of storage areas and transfers the program to the at least one of the plurality of storage areas, and
  second determines that the program can be executed on the main memory when the program can be stored in physically successive storage areas in the plurality of storage areas and transfers the program to the physically successive storage areas, the second determines includes:
    dividing an initial address of each of the plurality of storage areas by a size of each respective one of the plurality of storage areas to obtain a plurality of values, and
    third determining that storage areas are physically successive when the plurality of values are successive.

2. The information processing apparatus according to claim 1, further comprising:
an interface circuit connected with the arithmetic processing apparatus,
wherein the main memory is connected with a control circuit in the arithmetic processing apparatus, and
the auxiliary memory is connected with the control circuit via the interface circuit.

3. A method of controlling an arithmetic processing apparatus, the method, executed by the arithmetic processing apparatus, comprising:
executing a program stored in auxiliary memory for diagnosing a main memory that includes a plurality of storage areas and diagnosing an apparatus accessed by the arithmetic processing apparatus;
determining whether the program can be executed on the main memory, the determining includes determining that the program can be executed on the main memory when the program can be stored in at least one of the plurality of storage areas and determining that the program can be executed on the main memory when the program can be stored in physically successive storage areas of the plurality of storage areas, the determining includes:
  dividing an initial address of each of the plurality of storage areas by a size of each respective one of the plurality of storage areas to obtain a plurality of values, and
  determining that storage areas are physically successive when the plurality of values are successive;

executing the program on the main memory when the determining determines that the program can be executed on the main memory or executing by the arithmetic processing apparatus the program on the auxiliary memory when the determining determines that the program cannot be executed on the main memory; and transferring the program to the at least one of the plurality of storage areas when the determining determines that the program can be executed on the main memory, the transferring including transferring the program to the physically successive storage areas when the determining determines that the program can be executed on the main memory.

4. The method of controlling the arithmetic processing apparatus according to claim 3, wherein the arithmetic processing apparatus is connected with an interface circuit, the main memory is connected with a control circuit in the arithmetic processing apparatus, and the auxiliary memory is connected with the control circuit via the interface circuit.

5. A non-transitory computer-readable recording medium storing a program that causes an arithmetic processing apparatus execute:

executing a program stored in auxiliary memory for diagnosing a main memory that includes a plurality of storage areas and diagnosing an apparatus accessed by the arithmetic processing apparatus;

determining whether the program can be executed on the main memory, the determining includes determining that the program can be executed on the main memory when the program can be stored in at least one of the plurality of storage areas and determining that the program can be executed on the main memory when the program can be stored in physically successive storage areas of the plurality of storage areas, the determining includes:

dividing an initial address of each of the plurality of storage areas by a size of each respective one of the plurality of storage areas to obtain a plurality of values, and determining that storage areas are physically successive when the plurality of values are successive;

executing the program on the main memory when the determining determines that the program can be executed on the main memory or executing the program on the auxiliary memory when the determining determines that the program cannot be executed on the main memory; and transferring the program to the at least one of the plurality of storage areas when the determining determines that the program can be executed on the main memory, the transferring includes transferring the program to the physically successive storage areas when the determining determines that the program can be executed on the main memory.

6. The non-transitory computer-readable recording medium according to claim 5, wherein the arithmetic processing apparatus is connected with an interface circuit, the main memory is connected with a control circuit in the arithmetic processing apparatus, and the auxiliary memory is connected with the control circuit via the interface circuit.

\* \* \* \* \*